(12) United States Patent
Faure et al.

(10) Patent No.: US 9,242,444 B2
(45) Date of Patent: *Jan. 26, 2016

(54) METHOD OF FABRICATING A COMPOSITE STRUCTURE WITH A STABLE BONDING LAYER OF OXIDE

(71) Applicant: SOITEC, Bernin (FR)

(72) Inventors: Bruce Faure, Paris (FR); Alexandra Marcovecchio, Grenoble (FR)

(73) Assignee: SOITEC, Brenin (FR)

( * ) Notice: Subject to any disclaimer, the term of this patent is extended or adjusted under 35 U.S.C. 154(b) by 0 days.

This patent is subject to a terminal disclaimer.

(21) Appl. No.: 14/031,498

(22) Filed: Sep. 19, 2013

(65) Prior Publication Data

US 2014/0014029 A1    Jan. 16, 2014

Related U.S. Application Data

(63) Continuation of application No. 12/663,693, filed as application No. PCT/EP2008/068311 on Dec. 29, 2008, now abandoned.

(30) Foreign Application Priority Data

Jan. 21, 2008 (FR) ..................... 08 50359

(51) Int. Cl.
*H01L 21/762* (2006.01)
*H01L 33/00* (2010.01)
*B32B 37/14* (2006.01)

(52) U.S. Cl.
CPC .......... *B32B 37/14* (2013.01); *H01L 21/76254* (2013.01); *H01L 33/0079* (2013.01); *H01L 2924/0002* (2013.01); *Y10T 156/10* (2015.01); *Y10T 428/265* (2015.01)

(58) Field of Classification Search
CPC ................ H01L 21/76254; H01L 33/0079; H01L 21/2007; H01L 21/76251
See application file for complete search history.

(56) References Cited

U.S. PATENT DOCUMENTS 5,882,532 A     3/1999  Field et al.
6,146,979 A *  11/2000  Henley et al. .............. 438/458
(Continued)

FOREIGN PATENT DOCUMENTS

EP     0 898 307 B1   2/1999
FR     2 857 983 A1   1/2005
(Continued)

OTHER PUBLICATIONS

Korean Office Action for Korean Application No. 10-2010-7015993 dated Dec. 17, 2014, 8 pages.
(Continued)

*Primary Examiner* — Jarrett Stark
*Assistant Examiner* — Bitew Dinke
(74) *Attorney, Agent, or Firm* — TraskBritt

(57) ABSTRACT

A method of preventing microcavity formation in a bonding layer of a composite structure resulting from creep and thermal expansion due to high temperature exposure of the composite structure. The method includes the steps of providing a thin film with a thickness of 5 micrometers or less; providing a bonding layer of oxide with a thickness that is equal to or greater than the thickness of the thin film with the bonding layer formed by low pressure chemical vapor deposition. The thin film or support substrate have a mean thermal expansion coefficient of $7\times10^{-6}$ K$^{-1}$ or more. The thin film, bonding layer and support substrate combine to reduce stress in and plastic deformation of the bonding layer during exposure to high temperatures of more than approximately 900° C. to thus prevent microcavities from appearing in the bonding layer.

15 Claims, 5 Drawing Sheets

(56) References Cited

U.S. PATENT DOCUMENTS

| | | | |
|---|---|---|---|
| 6,251,754 B1* | 6/2001 | Ohshima et al. | 438/506 |
| 6,335,263 B1* | 1/2002 | Cheung et al. | 438/455 |
| 6,756,285 B1 | 6/2004 | Moriceau et al. | |
| 7,008,859 B2 | 3/2006 | Letertre et al. | |
| 7,452,785 B2 | 11/2008 | Kononchuk et al. | |
| 8,153,500 B2* | 4/2012 | Faure et al. | 438/406 |
| 2003/0159644 A1 | 8/2003 | Yonehara et al. | |
| 2004/0014299 A1* | 1/2004 | Moriceau et al. | 438/459 |
| 2004/0029359 A1* | 2/2004 | Letertre et al. | 438/458 |
| 2004/0241958 A1 | 12/2004 | Guarini et al. | |
| 2005/0020031 A1* | 1/2005 | Letertre et al. | 438/455 |
| 2006/0035440 A1* | 2/2006 | Ghyselen et al. | 438/458 |
| 2006/0060894 A1* | 3/2006 | Kim et al. | 257/275 |
| 2006/0076559 A1 | 4/2006 | Faure et al. | |
| 2006/0197126 A1 | 9/2006 | Lochtefeld et al. | |
| 2006/0240644 A1 | 10/2006 | Le Vaillant | |
| 2006/0255341 A1 | 11/2006 | Pinnington et al. | |
| 2007/0020947 A1* | 1/2007 | Daval et al. | 438/758 |
| 2007/0054466 A1 | 3/2007 | Hebras | |
| 2007/0080372 A1 | 4/2007 | Faure et al. | |
| 2007/0134887 A1* | 6/2007 | Bourdelle et al. | 438/458 |
| 2008/0038564 A1 | 2/2008 | Bruel | |
| 2008/0153272 A1* | 6/2008 | Akiyama et al. | 438/513 |
| 2008/0293217 A1* | 11/2008 | Ghyselen et al. | 438/458 |
| 2008/0311726 A1 | 12/2008 | Ohnuma et al. | |
| 2009/0170282 A1 | 7/2009 | Dong | |
| 2009/0289332 A1* | 11/2009 | Boussagol et al. | 257/618 |
| 2010/0025228 A1* | 2/2010 | Tauzin et al. | 204/192.11 |
| 2010/0044829 A1* | 2/2010 | Matsumine | 257/506 |
| 2010/0190000 A1* | 7/2010 | Faure et al. | 428/336 |
| 2010/0210089 A1* | 8/2010 | Kasai et al. | 438/458 |
| 2010/0291753 A1* | 11/2010 | Kakehata et al. | 438/458 |

FOREIGN PATENT DOCUMENTS

| | | |
|---|---|---|
| JP | 2002536843 A | 10/2002 |
| JP | 2006528592 A | 12/2006 |
| WO | 2005014895 A1 | 2/2005 |
| WO | WO 2008/093008 A2 | 8/2008 |

OTHER PUBLICATIONS

International Search Report, Application No. PCT/EP2008/068311, Sep. 11, 2009.

International Preliminary Report on Patentability, Application No. PCT/EP2008/068311, dated Jul. 27, 2011, 7 pages.

Written Opinion of the International Searching Authority for International Application No. PCT/EP2008/068311, dated Sep. 11, 2009.

Chinese Office Action for Chinese Application No. 200880125235.6 dated Jul. 7, 2015, 10 pages with translation.

* cited by examiner

US 9,242,444 B2

METHOD OF FABRICATING A COMPOSITE STRUCTURE WITH A STABLE BONDING LAYER OF OXIDE

CROSS-REFERENCE TO RELATED APPLICATIONS

This application is a continuation of U.S. patent application Ser. No. 12/663,693, filed on Dec. 8, 2009, which is a National Phase Entry under 35 U.S.C. §371 of International Application Ser. No. PCT/EP2008/068311, filed on Dec. 29, 2008, which, in turn, claims priority to French Patent Application No. FR 0850359, filed on Jan. 21, 2008.

TECHNICAL FIELD AND PRIOR ART

The present invention relates to the fabrication of composite structures comprising at least one support substrate onto which a thin film is bonded via a deposited bonding layer of oxide. That type of structure is particularly intended for use in the field of microelectronics, optoelectronics, and optics to produce, by epitaxial growth, semiconductor materials such as those of type III/V, in particular binary, ternary, or quaternary type III/N materials, such as GaN, AlGaN, InGaN, or InAlGaN.

That type of composite structure is generally produced using the well-known SMARTCUT® technique that consists of:
  subjecting a source substrate or donor substrate to ion implantation to create a zone of weakness at a certain depth in the substrate;
  bonding (by wafer bonding) the face of the donor substrate that has undergone implantation with a support substrate or "receiving substrate"; and
  detaching the donor substrate by fracture at the zone of weakness to transfer the portion located between the face that has undergone implantation and the zone of weakness of the donor substrate to the receiving substrate, the transferred portion constituting the thin film of the composite structure.

In order to facilitate detachment of the thin film from the source substrate, good bonding between the source substrate and the support substrate is necessary. It is ensured by a bonding interface produced between two bonding layers that then endows the composite structure with great stability even with materials with differing coefficients of thermal expansion. The bonding layers correspond to layers of oxide formed on the faces of the source substrate and the support substrate intended to be brought into intimate contact. These oxide layers act as planarization layers that encourage intimate contact of the substrates during wafer bonding. The composite structure may then undergo processes involving large variations in temperatures, such as epitaxial growth, without being deteriorated.

The fabrication of a composite structure for epitaxial growth may also be carried out using a step of bonding the source substrate and a support substrate followed by a chemical thinning step or a mechanical polishing step carried out on the source substrate, to reach the desired thickness of the thin film. That type of fabrication also requires bonding that is highly temperature-stable and, as a result, the use of a bonding layer of oxide to guarantee a good bonding interface.

With a material formed from silicon or silicon carbide (SiC), the substrate is oxidized by heating in an appropriate atmosphere to obtain a bonding layer of oxide of silicon ($SiO_2$) that is termed "thermal oxide," that corresponds to a stoichiometric oxide, that is dense ($SiO_2$ is defined as dense when it is slowly attacked by a solution of HF), and that remains stable at high temperature.

When bonding two substrates, one of which is a material that cannot produce such a layer of oxide of silicon by thermal oxidation, as with a sapphire substrate, for example, it is necessary to form the oxide of silicon by deposition using a technique, such as plasma enhanced chemical vapor deposition (PECVD) or low pressure chemical vapor deposition (LPCVD). This is then a "deposited oxide," that has a composition that is different from stoichiometric $SiO_2$ obtained by thermal oxidation (the oxide deposited has a composition of the type $Si_xO_yH_z$). This deposited oxide is less dense and does not have the same properties as thermal oxide. A heat treatment may be carried out in order to densify it and to approach the properties of the thermal oxide. However, even after densification annealing, the deposited oxide may still be temperature-unstable, in particular during treatments carried out at temperatures that are higher than the oxide deposit temperature.

When a composite substrate, formed by a sapphire support substrate on which a thin layer of sapphire is laid, is heated to prepare it for GaN epitaxy, for example, microcavities appear once the oxide deposition temperature is exceeded. The microcavities appear exclusively at the bonding layer of deposited oxide of silicon. They are visible at the surface of the thin film of sapphire by the formation of irreversible blisters that "buckle" its surface and render it unsuitable for epitaxy because the surface is no longer smooth and the lattice parameter is distorted. The microcavities in the deposited oxide layer appear and develop more rapidly as the temperature is raised.

As a function of their density and their size, such microcavities may generate a zone of weakness in the bonding layer and the operations subsequently carried out on the structure will result in delamination of the thin film. Such microcavities may even affect the entire volume of the oxide layer and cause it to rupture and, consequently, cause detachment of the thin film from the support substrate. Thus, whether during fabrication of the composite structure or during subsequent epitaxy, the presence of such microcavities always results in delamination of the thin film.

In order to illustrate this problem, the Applicant carried out the following experiment. A source substrate of sapphire, comprising a zone of weakness such that the thin film to be transferred had a thickness of 0.6 μm (micrometer), was bonded to a sapphire support with a bonding layer of oxide deposited by PECVD at 300° C. to a thickness of 0.3 μm. To this end, the two substrates were brought into intimate contact at ambient temperature, then a splitting heat treatment was applied followed by bonding reinforcement annealing at 1100° C. for 3 hours. Total delamination of the transferred sapphire film was then observed due to detachment within the deposited oxide layer.

European Patent EP-A-0 898 307 describes a method of unbonding a wafer from a support at a bonding interface by using an oxide bonding layer formed by PECVD. That oxide has the peculiarity of having OH species that diffuse to the bonding interface under the action of a heat treatment (600° C.-1350° C.) carried out after bonding stabilization annealing and the desired treatments on the integrated circuits. The OH species develop until a gas is formed and they then form bubbles that diffuse and are concentrated locally at the bonding interface, i.e., the interface located between the oxide bonding layer deposited on the wafer and the support substrate. That phenomenon encourages weakening of the bonding interface until the support substrate unbonds completely from the bonding layer, the bonding layer initially deposited on the wafer remaining integral with the wafer.

However, in contrast to what is described in European patent EP-A-0 898 307, which describes a concentration of gaseous species and bubbles at the bonding interface, the microcavities that are to be prevented in the present invention are formed throughout the deposited oxide layer and when the temperature of the heat treatment applied exceeds that for creep of the oxide subjected to a high stress (>100 MPa (megapascals)), i.e., in the range approximately 800° C. to 1200° C. for layers of $SiO_2$ not intentionally doped and deposited by LPCVD or PECVD techniques. The microcavities have the effect of deforming the surface of the transferred thin film, which impedes certain applications such as epitaxy. Further, the delamination of the film observed by the Applicant derives from detachment within the oxide layer, the bonding layer not being unbonded at the bonding interface but ruptured by the microcavities developed throughout its volume.

U.S. Patent Publication No. 2006/0255341 describes the fabrication of a composite substrate by transfer of a seed thin film onto a support substrate, intended for epitaxial growth of III/N materials. Direct bonding (without an oxide layer) of a thin layer of sapphire onto a support substrate that has a lower thermal expansion coefficient requires a high pressure that causes a folding phenomenon in the thin layer. Transfer of the layer of sapphire requires implantation of a large dose of ionic species, thereby creating a stress gradient through the thickness of the transferred layer. When the stress increases due to the bonding conditions, the material deforms, and allows the stress to be relieved. To remedy that, the document describes the use of a layer of sapphire with a thickness on the order of 800 nm (nanometer) to enhance the mechanical strength of the layer.

The document also describes, during a transfer process, a phenomenon of delamination of the thin layer of sapphire, which is a rigid material, due to stress induced by implantation, by the difference in the thermal expansion coefficients of the materials, and by its surface that is fairly inert chemically speaking and does not tend to form covalent bonds with other material surfaces. To overcome that, it is possible to use plasma treatment to activate the surface, a bonding layer of $SiO_2$, $Si_3N_4$, AlN, and/or an adhesive layer.

SUMMARY OF THE INVENTION

The invention aims to overcome the above-mentioned disadvantages and proposes composite structures wherein the thin film and support substrate have a mean coefficient of thermal expansion that is $7 \times 10^{-6}$ $K^{-1}$ or more in the range of temperatures to which the structure will be subjected, for example, from 20° C. to 1200° C., and wherein the bonding layer comprises at least one deposited layer of oxide of silicon that remains stable even at high temperature. The invention aims to allow the fabrication of such composite structures in order to avoid the formation and development of microcavities in the deposited oxide layer resulting in deformation of the thin film and in its delamination during heat treatments applied during the fabrication of the composite structure and to allow the formation of materials by epitaxy starting from the composite structure.

This aim is accomplished by means of a method of fabricating a composite structure in which the bonding layer of oxide of silicon is formed by low pressure chemical vapor deposition (LPCVD) of a layer of oxide on the bonding face of the support substrate and/or on the bonding face of the thin film, while the thickness of the thin film is 5 micrometers or less and the thickness of the layer of oxide of silicon is equal to or greater than that of the thin film.

As explained below in detail, using a bonding layer formed by LPCVD, wherein the thickness is greater than that of the thin film, prevents plastic (irreversible) deformations within the bonding layer. Thus, the formation of microcavities in the deposited bonding layer of oxide of silicon is avoided, even during heat treatments at high temperature (in particular higher than 900° C.).

Following a study, detailed below, on the temperature behavior of layers of oxide of silicon as a function of the deposition technique employed, the Applicant has determined that deposition by LPCVD can produce oxides with temperature stability that is close to that of oxides of silicon obtained by thermal oxidation. Further, to resist stresses due to the presence of materials with expansion coefficients that are high compared with that of the oxide layer in the composite structure, the thickness of the oxide layer is greater than or equal to that of the thin film that is limited to 5 micrometers. This means that the stresses applied at the bonding layer during high temperature treatments can be reduced, as well as the risk of plastic deformations occurring in the bonding layer.

The material of the bonding layer of oxide of silicon formed by low pressure chemical vapor deposition may be produced using different known precursors such as silane, dichlorosilane, or TEOS (tetra-ethyl orthosilicate).

In accordance with one aspect of the invention, prior to bonding, the method further comprises a step of densification heat treatment of the layer of oxide of silicon deposited by low pressure chemical vapor deposition on the bonding face of the support substrate and/or on the bonding face of the thin film. This densification heat treatment can further increase the temperature behavior of the deposited oxide as regards the formation of microcavities. This step can, if necessary, reduce the ratio of the thickness of the deposited oxide layer to the thickness of the thin film.

The heat treatment step is carried out at a temperature that is higher than the temperature at which the oxide bonding layer is deposited. Optionally, the heat treatment may be carried out in a neutral or oxidizing atmosphere, for example.

In accordance with a particular characteristic of the method of the invention, the thin film may be obtained using the SMARTCUT® technique. The method then further comprises:
 a step of implantation by bombardment of one face of a donor substrate using ions to form, at a predetermined depth in the substrate, a layer of weakness defining the thin film in the upper portion of the substrate;
 a step of bonding by placing the donor substrate in intimate contact with the support substrate;
 a step of detachment of the thin film in contact with the support substrate by splitting at the layer of weakness formed in the donor substrate.

In accordance with a particular characteristic of the invention, the thin film may be produced with:
 a step of bonding by bringing a donor substrate into intimate contact with the support substrate;
 a step of chemical or mechanical thinning of the donor substrate to form the thin film.

After the bonding step, a step of bonding stabilization annealing may be carried out at a temperature of more than approximately 900° C. without microcavities appearing in the deposited layer of oxide.

The invention also provides a method of producing at least one layer of semiconductor material, in particular materials of the binary, ternary, or quaternary III/V and III/N types, such as GaN, AlGaN, InGaN, or InAlGaN, by epitaxial growth on a composite structure fabricated in accordance with the fabrication method described above, epitaxial growth being carried out from the thin film of the composite structure that forms a crystalline seed layer for growth.

In accordance with one aspect of the invention, epitaxial growth is carried out over a predetermined period corresponding to the formation of a layer of semiconductor material with a thickness that is sufficient to be self-supporting alone, namely a thickness of at least 100 µm, that allows removal of the composite structure after epitaxy. In a variation, the crystalline seed layer for growth may be preserved with the layer of epitaxially grown semiconductor material to form a self-supporting structure that may be used for repeated epitaxy. Epitaxial growth of the layer of semiconductor material is then carried out for a predetermined period that allows a cumulative thickness of the seed layer and semiconductor layer of at least 100 µm to be produced.

In accordance with a further aspect of the invention, epitaxial growth is carried out for a predetermined period corresponding to the formation of a layer of semiconductor material with a thickness of at least 10 µm, before any annealing of the composite structure, which corresponds to a thickness sufficient to withstand the conditions for a new epitaxial growth step in the same epitaxy equipment, provided that the layer obtained does not have to be manipulated. When the crystalline seed layer is preserved (only the support is detached), growth is carried out for a period that can produce a cumulative thickness of the seed layer and the semiconductor layer of at least 10 µm.

The invention also envisages a composite structure produced in accordance with a method of fabricating a composite structure as described above.

DETAILED DESCRIPTION OF THE INVENTION

Figure 1A:
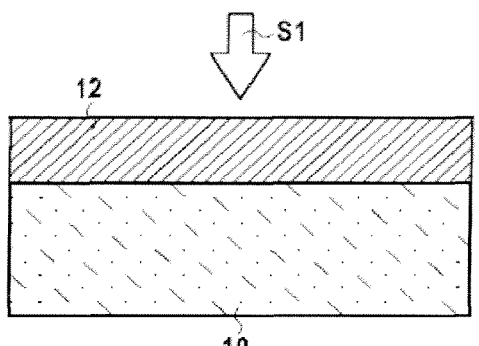
FIGS. 1A to 1I are diagrammatic sectional views showing production of a composite structure and epitaxy in accordance with one implementation of the invention.

The present invention is generally applicable to the production of composite structures comprising at least one thin film bonded to a support substrate via a bonding layer formed by deposition between the support substrate and the thin film, the thin film and the support substrate having a thermal expansion coefficient of $7 \times 10^{-6} K^{-1}$ or more over a temperature range extending from ambient temperature (20° C.) to 1200° C.

The Applicant has observed that the phenomenon of microcavity formation in the bonding layer of oxide of silicon in the presence of high temperatures occurs when the bonding layer is a layer of oxide formed by deposition and the composite structure comprises one or more materials with a thermal expansion coefficient of $7 \times 10^{-6} K^{-1}$ or more. The microcavities are larger when the thermal expansion coefficients of the materials used are high at the temperature reached during fabrication of the composite structure or during its subsequent use (epitaxy). The formation and development of microcavities within the deposited oxide layer has been observed at temperatures above the oxide deposition temperature. The appearance of microcavities in the oxide may be explained by the transition from an elastic mode of deformation to a plastic mode of deformation, which is thus not reversible. Elastic deformation is characterized by a modification of the initial state of the oxide, for example, under the action of a mechanical stress, and its return to the initial state once the stress is withdrawn. Plastic deformation results in irreversible deformation after which the oxide cannot regain its initial state once the mechanical stress is withdrawn. The transition to plastic deformation occurs when a stress threshold is reached in the oxide. This transition is linked to temperature, to the creep characteristics of the oxide and to the stress applied by the difference in expansion of the bonded materials and the oxide. The creep temperature of the oxide is one of the characteristics of the oxide that indicates the temperature beyond which the oxide changes from an elastic deformation mode to a plastic deformation mode when it is not subjected to a stress. Temperature increases the rate of creep of the oxide. Thus, the level of stress to be applied to provoke the formation of microcavities in the deposited oxide layer is lower when the oxide has an intrinsic capacity to creep easily, especially due to the temperature applied vis-à-vis its creep temperature.

As a result, to prevent the formation and development of microcavities within the deposited oxide layer in a composite structure as described above, it is necessary to use both a deposited oxide where creep is difficult to provoke and to reduce the stresses applied to the oxide during high temperature treatments.

The Applicant has studied the temperature behavior of oxides of silicon obtained by different deposition techniques and has discovered that a bonding oxide deposited by low pressure chemical vapor deposition, also termed LPCVD, can reduce its capacity to creep. The experiments carried out by the Applicant have shown that the properties of the oxide have a substantial influence on the formation of microcavities in the bonding layer and that these properties can be influenced by the deposition technique employed.

The following three types of oxides of silicon, formed using different techniques and different gaseous precursors, were tested for bonding of a thin film of sapphire onto a sapphire support substrate:

oxide of silicon produced from a silane precursor, deposited at 300° C. by plasma enhanced chemical vapor deposition or PECVD;

oxide of silicon produced from a silane precursor deposited at 800° C. by LPCVD (also termed "HTO silane," HTO meaning high temperature oxide) (if the oxide is deposited by PECVD, and thus at a lower temperature, it is not termed HTO silane);

oxide of silicon produced from a dichlorosilane (DCS) precursor deposited at 900° C. by LPCVD (also termed "HTO DCS").

Microcavity formation is less significant with HTO silane and HTO DCS. In contrast, microcavity formation is more significant with oxide of silicon deposited by PECVD deposition. It thus appears that creep of the deposited oxides is more difficult to provoke when they are deposited by the LPCVD technique.

Furthermore, since the formation of microcavities is linked to the stress due to high thermal expansion coefficients of the materials of the structure, the invention also proposes reducing that stress by forming (by transfer or by mechanical or chemical thinning) a thin film thickness of 5 µm or less and of forming a deposited layer of oxide for bonding with a thickness that is greater than or equal to that of the thin film. Thus, mechanical stresses, derived from the difference in expansion of materials during thermal treatments carried out on the structure, are limited so that they do not exceed the plastic deformation (creep) threshold of the oxide at the temperature under consideration.

As an example, the Applicant has carried out tests that showed that when a film of sapphire with a thickness of 0.5 µm is transferred onto a 0.3 µm thick bonding layer of HTO silane oxide deposited by LPCVD, delamination of the film took place after a heat treatment carried out at 1100° C. for 3 hours. In contrast, when a 0.3 µm thick film of sapphire was transferred onto a bonding layer that was also 0.3 µm thick of HTO silane oxide deposited by LPCVD, neither delamination nor microcavities appeared after a heat treatment carried out at 1100° C. for 3 hours.

In general and in accordance with the invention, the higher the thermal expansion coefficient of the material of the thin film, the thinner it must be relative to the thickness of the deposited oxide layer. As an example, the thickness of the thin film should be significantly reduced relative to that of the deposited oxide layer when the thin film is formed from lithium tantalate (LiTaO$_3$) that has a thermal expansion coefficient of $16 \times 10^{-6} K^{-1}$ at ambient temperature. The skilled person is able to determine without particular difficulty the necessary reduction in the thickness of the thin film compared with that of the deposited oxide as a function of the thermal expansion coefficient of the material of the thin film.

In addition, the temperature behavior of the deposited oxide may be improved by using an oxide obtained by LPCVD deposition that has a density that is as close as possible to that of the thermal oxide. To this end, a densification anneal may be applied to the oxide deposited by LPCVD prior to bonding.

With a composite structure comprising a 0.5 µm thick thin film of sapphire on a sapphire support substrate with a 0.2 µm thick bonding layer of HTO DCS oxide, a bonding stabilization anneal carried out at 900° C. for 1 hour provokes complete delamination of the sapphire film. In contrast, when the HTO DCS oxide of the same composite structure is annealed for 30 minutes at 1200° C. in a nitrogen atmosphere (N$_2$) before carrying out bonding, a bonding stabilization anneal carried out at 1050° C. for 1 hour does not lead to delamination of the thin film.

However, microcavities still appear and the surface of the transferred film is damaged. The quality and resistance to delamination of the thin film of the composite structure are thus not sufficient for subsequent applications such as epitaxy. The oxide densification anneal reduces its propensity to form microcavities but is not sufficient for the envisaged applications. With materials with high thermal expansion coefficients such as sapphire, the stresses linked to differences in the thermal expansion coefficients must also be reduced by increasing the ratio of the thickness of the oxide layer to the thickness of the transferred thin film, as explained above.

Thus, a composite structure produced in accordance with the invention can withstand temperatures of more than 900° C. for the epitaxy of materials such as materials of type III/N including GaN and other ternary or quaternary alloys, AlN, AlGaN, InGaN, AlGaInN, and BGaN. Furthermore, the epitaxially grown layer may be composed of a stack of these various materials, in particular to constitute the active layers for an LED or laser diode.

The composite structure of the present invention is particularly suitable for materials with high thermal expansion coefficients (TEC), i.e., a mean of $7 \times 10^{-6} K^{-1}$ or more over a temperature range extending from ambient temperature (20° C.) to 1200° C. In particular, the structure may comprise a thin film and/or the support substrate formed from sapphire (Al$_2$O$_3$) (TEC of $7.5 \times 10^{-6} K^{-1}$), lithium tantalate (LiTaO$_3$) (TEC of $16 \times 10^{-6} K^{-1}$), LiNbO$_3$ (TEC of $15 \times 10^{-6} K^{-1}$) and HAYNES® 230® Alloy (TEC of $11.8 \times 10^{-6} K^{-1}$), which is a commercial alloy primarily composed of Ni, Cr, Mo, W (HAYNES® 230® Alloy is not used for the thin film when the film is intended for use as a seed layer for epitaxy), or MgO.

As is well known, as a function of the nature of the crystalline seed layer for growth, various binary, ternary or quaternary III/V or III/N semiconductor materials may be formed. In particular, the composite structure for epitaxy of the invention is intended for the epitaxial growth of GaN, InGaN, AlGaN, AlGaInN, and indium nitride (InN).

A method of fabricating a composite structure followed by a method of producing a layer of semiconductor material, here a III/N material, by epitaxy in accordance with an implementation of the invention is described with reference to FIGS. 1A to 1I and 2.

Production of the composite structure for epitaxy commences by depositing a bonding layer 12 on one face of a support substrate 10 (step S1, FIG. 1A). In the example described here, the support substrate 10 is formed from sapphire (Al$_2$O$_3$). The bonding layer 12 is a layer of HTO silane deposited by LPCVD at a deposition temperature of 800° C. for a period that can deposit a thickness of HTO silane of approximately 0.5 µm. The deposited oxide is then densified by applying a densification anneal carried out at 1200° C. for 30 minutes in a nitrogen atmosphere (step S2).

Figure 1B:
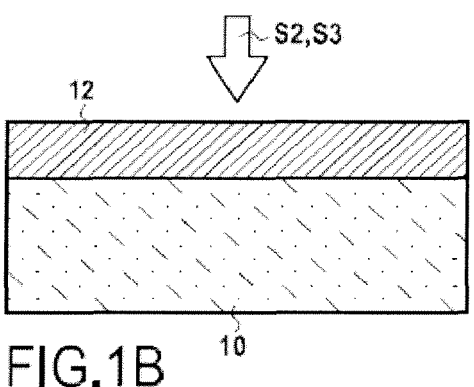
Figure 1C:
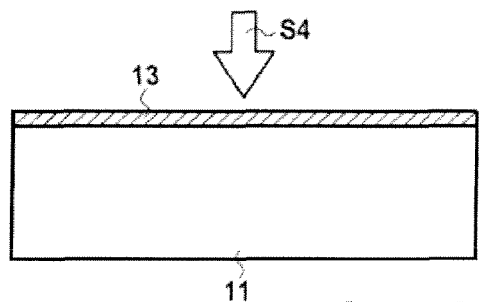
Figure 1D:
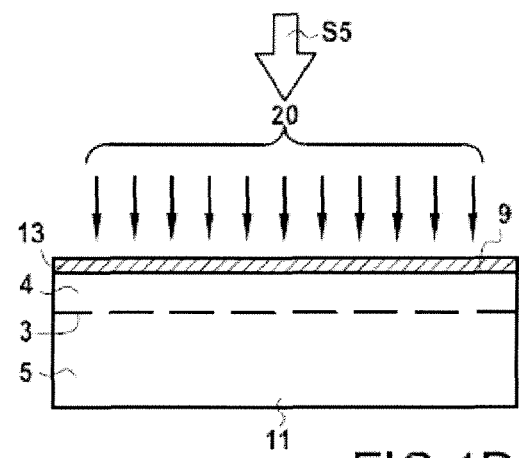

The surface of the layers of bonding oxide 12 is planarized by chemical-mechanical polishing (CMP) to obtain a surface roughness of less than 5 Å (Angstrom) RMS over a surface area of 5×5 µm$^2$ and thereby facilitate subsequent intimate contact (step S3, FIG. 1B). Thus, after polishing, the layer 12 has a thickness of 0.3 µm±0.05 µm.

An oxide layer 13 may also be formed on a donor substrate 11 formed from sapphire. The layer 13 is a layer of HTO DCS or HTO silane deposited by LPCVD at a deposition temperature of 900° C. for a period enabling a thickness of HTO silane of approximately 0.2 µm to be deposited (step S4, FIG. 1C). The layer 13 acts as a protective layer for implantation.

Next, implantation is carried out wherein the donor substrate 11 undergoes ionic bombardment 20 with hydrogen ions H' through the planar face 9 of the donor substrate 11 comprising the oxide layer 13. Implantation of H' ions is carried out at an implantation dose in the range of $1 \times 10^{17}$ atoms/cm$^2$ (atoms/square centimeter) to $4 \times 10^{17}$ atoms/cm$^2$ and with an implantation energy in the range of 30 keV (kilo-electron volt) to 200 keV. Implantation is carried out at a temperature in the range of 20° C. to 400° C., preferably in the range of 50° C. to 150° C. for a period of 1 minute to 10 hours. These implantation conditions can create, at a predetermined depth in the donor substrate 11, a layer of defects or a layer of weakness 3 parallel to the face 9 of the donor substrate 11, defining a thin film 4 in the upper region of the substrate 11 with a thickness of 5 µm or less and at the thickness of the bonding layer 12, and also a portion 5 in the lower region of the substrate 11 corresponding to the remainder of the substrate 11 (step S5, FIG. 1D). It is also possible to use ionic implantation of other species such as helium or argon, as well as co-implantation combining two species such as hydrogen and helium.

Figure 1E:
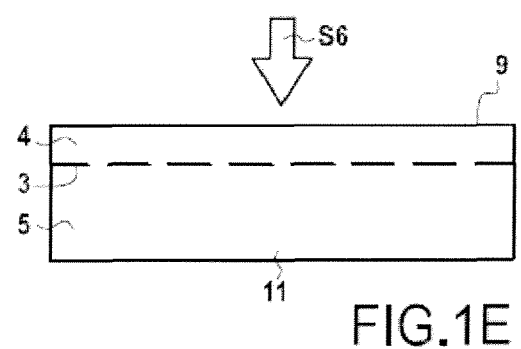

Next, the protective oxide layer 13 is annealed (step S6, FIG. 1E). In order to eliminate the protective layer, a suitable chemical technique is employed that depends on the nature of the layer or layers to be withdrawn. As an example, a protective layer of oxide of silicon is readily removed by etching with a dilute 10% HF solution or using mixtures known as BOE (buffered oxide etch).

Optionally, the surface of the layer 12 as well as the surface of the donor substrate 11 may be exposed to plasmas based in particular on oxygen, nitrogen or argon that can activate the bonding surfaces and increase their adhesive capacity (steps S7, S7').

Figure 1F:
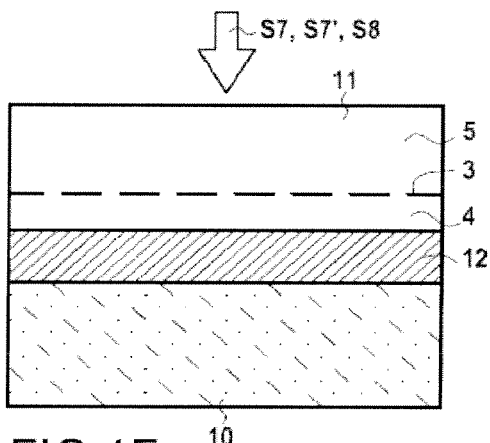

Next, bonding is carried out by bringing the face of the HTO silane layer 12 into intimate contact with the face 9 of the donor substrate 11 that has undergone implantation (step S8, FIG. 1F). Bonding is carried out by wafer bonding. The principle of bonding by wafer bonding is known per se and is not described in further detail. It should be recalled that bonding by wafer bonding is based on bringing two surfaces into intimate contact, i.e., without the use of a specific material (adhesive, wax, low melting point metal, etc.), the attractive forces between the two surfaces being high enough to provoke molecular bonding (bonding induced by the ensemble of the attractive forces (Van der Waals forces) of electronic interaction between atoms or molecules of the two surfaces to be bonded).

Figure 1G:
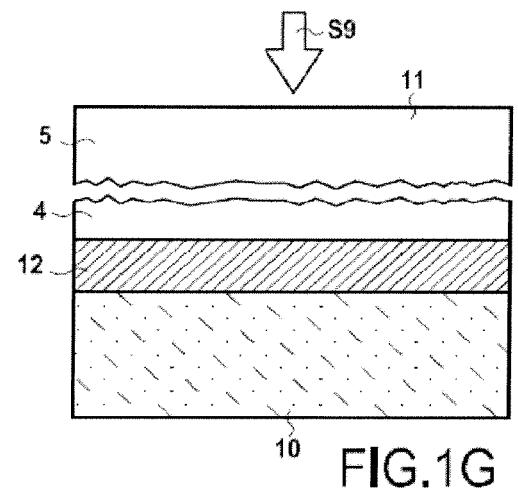

The assembly of the two substrates then undergoes splitting annealing to provoke fracture of the donor substrate 11 at the plane of weakness 3 and transfer proper of the thin film 4 onto the support substrate 10 (step S9, FIG. 1G). Splitting annealing is carried out at 650° C. for 5 hours.

In addition, a bonding stabilization anneal is carried out at 1050° C. for 2 hours without deformations appearing on the surface of the thin film 4 (step S10).

The surface of the film 4 may then be prepared for epitaxy, for example, by polishing the surface roughness, by light chemical etching (step S11, FIG. 1H) or plasma etching or any other surface treatment allowing the surface to be prepared for epitaxy.

Figure 1H:
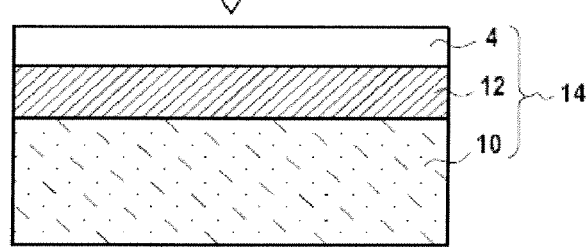

As can be seen in FIG. 1H, a composite structure 14 is obtained comprising the support substrate 10, an oxide bonding layer 12 of HTO silane deposited by LPCVD and a thin film 4 of sapphire that may act as a crystalline seed layer for growth.

Figure 1I:
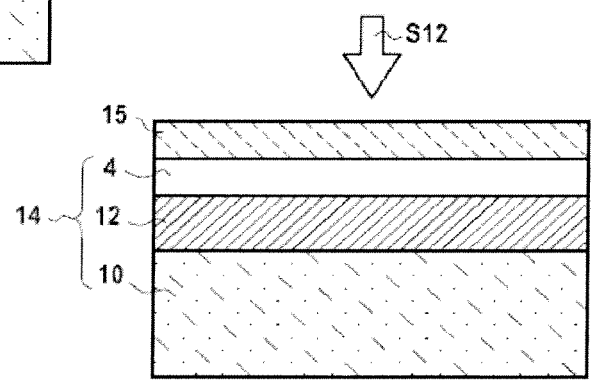
Figure 2:
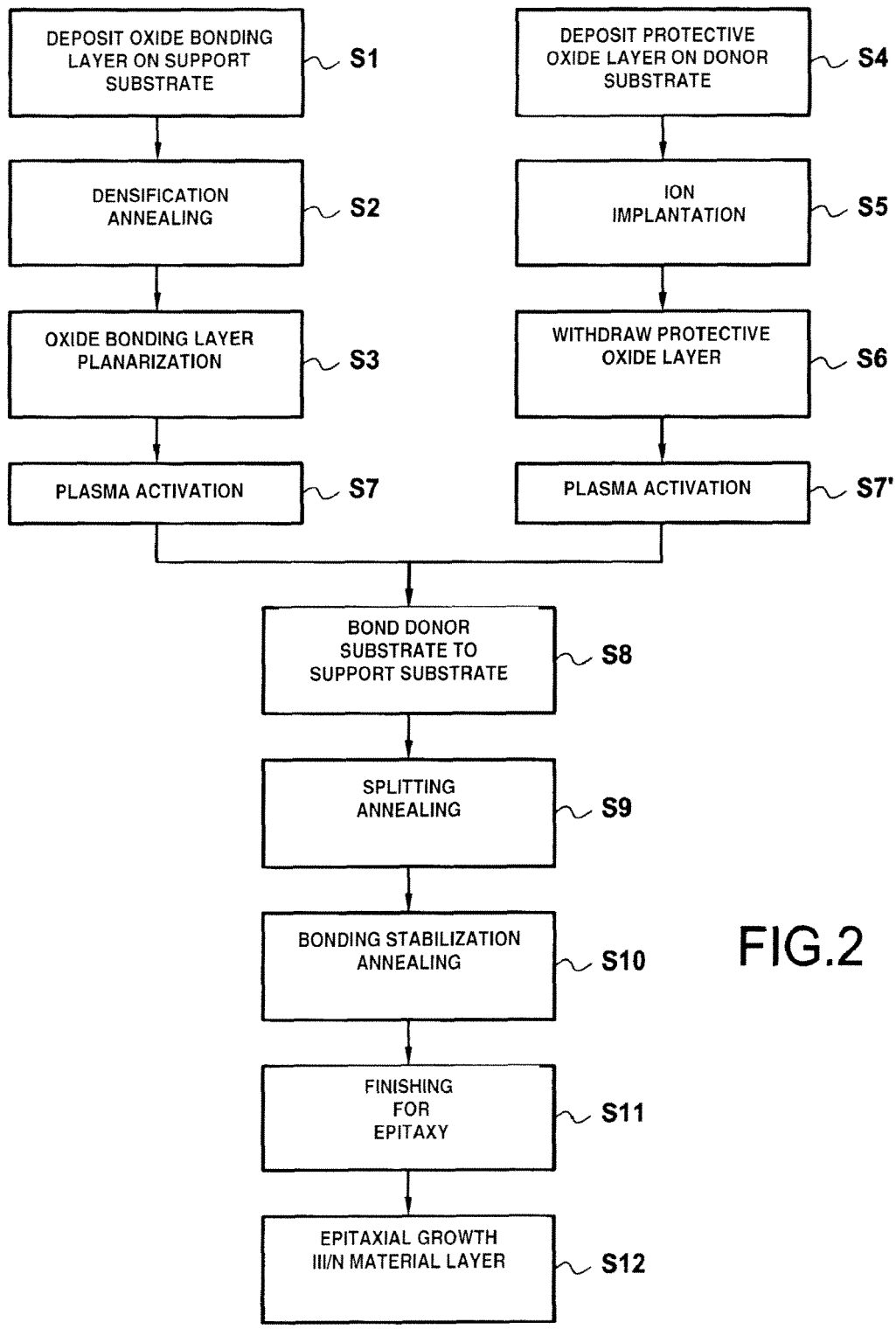
FIG. 2 is a flowchart of the steps carried out in FIGS. 1A to 1I.

In the example described here, epitaxial growth of a layer of gallium nitride (GaN) 15 is carried out on the thin film 4 (step S12, FIG. 1I). Epitaxial growth is carried out at 1050° C. for 3 hours, for example, using hydride vapor phase epitaxy, HVPE. No microcavities nor any delamination was observed after the epitaxy.

Another mode of fabrication of a composite structure in accordance with the present invention is described with reference to FIGS. 3A to 3D and 4.

Figure 3A:
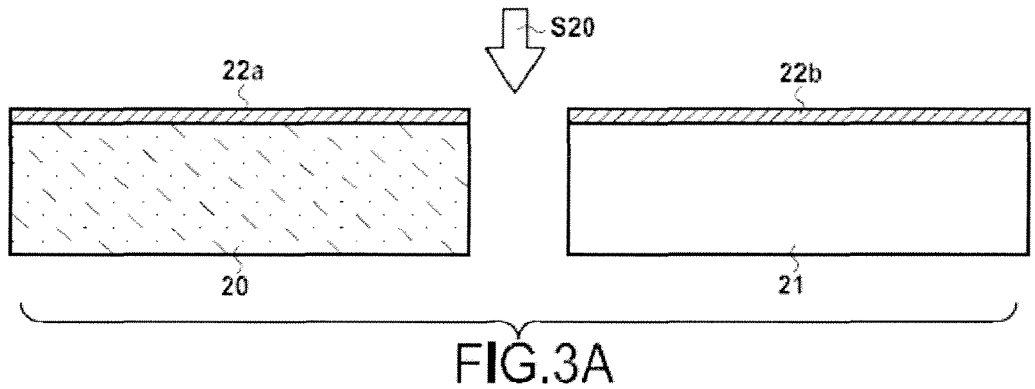
FIGS. 3A to 3D are diagrammatic sectional views showing production of a composite structure and epitaxy in accordance with another implementation of the invention.
Figure 3B:
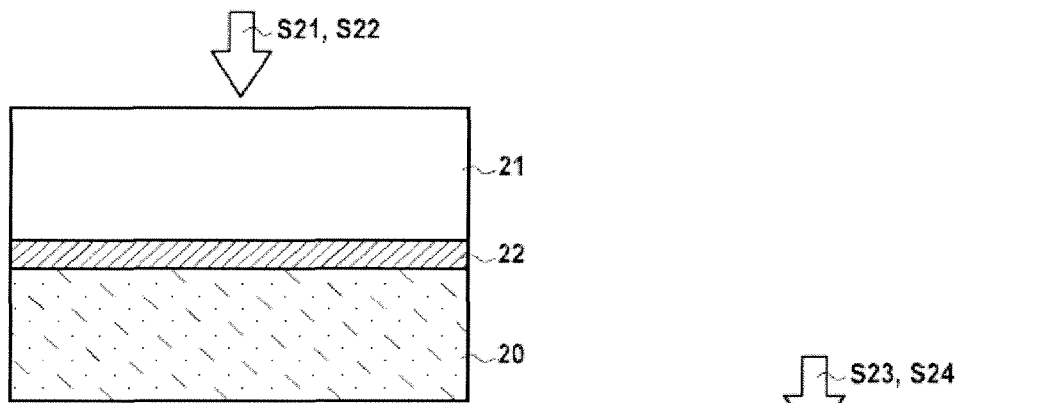

In the implementation presented here, a bonding layer of oxide of silicon, for example, HTO silane or HTO DCS, is deposited by LPCVD both on the face of a support substrate 20 and on a face of a donor substrate 21, both of sapphire (step S20, FIG. 3A). The support substrate 20 and the donor substrate 21 each respectively comprise a bonding layer of oxide 22a, 22b.

The layers of bonding oxide 22a, 22b are then polished to prepare for wafer bonding of the two substrates 20, 21 (step S21). Each layer 22a, 22b has a final thickness of approximately 0.4 µm after polishing.

Once the layers 22a and 22b have been polished, they are brought into intimate contact to allow bonding of the two substrates 20, 21 by wafer bonding (step S22, FIG. 3B), the combination of layers 22a and 22b forming a single deposited layer of oxide 22 with a thickness of approximately 0.8 µm.

A bonding stabilization anneal is then carried out between 200° C. and 800° C. for 1 to 5 hours (step S23).

Figure 3C:
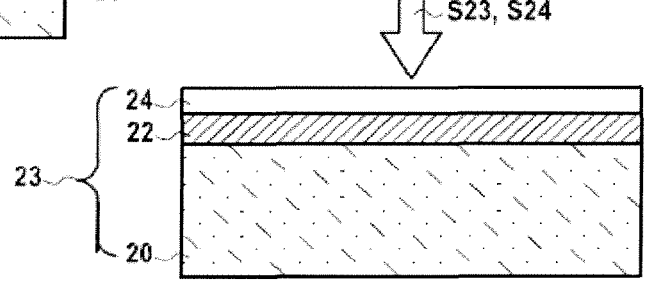
Figure 3D:
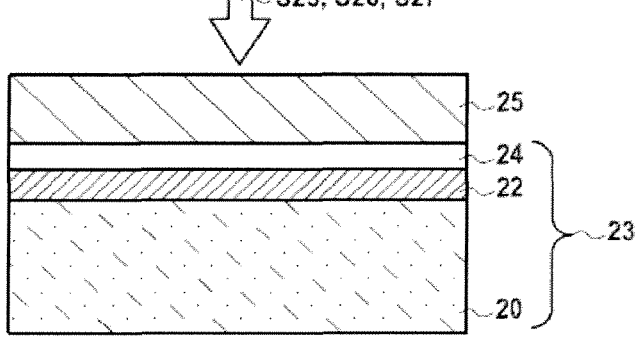
Figure 4:
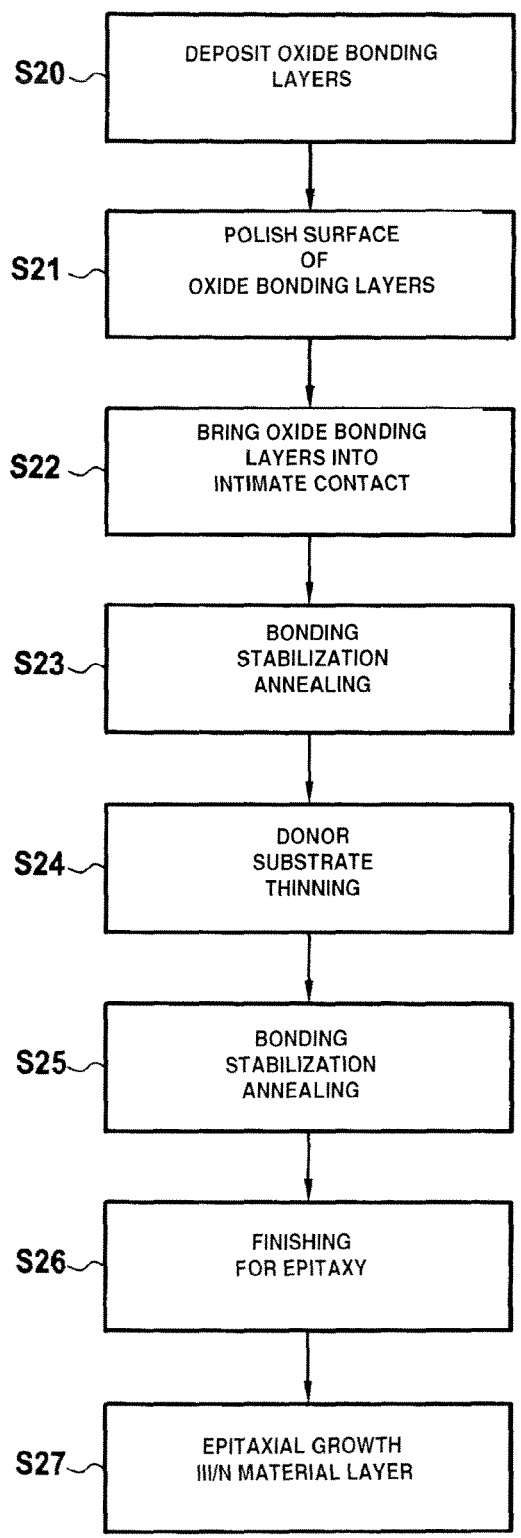
FIG. 4 is a flowchart of the steps carried out in FIGS. 3A to 3D.

The donor substrate 21 is thinned to a thickness of 0.3 µm (step S24, FIG. 3C). The thinning is carried out by mechanical polishing of the exposed face of the donor substrate 21.

As can be seen in FIG. 3C, a composite structure for epitaxy 23 is obtained thereby comprising the support substrate 20, a bonding layer of oxide 22 (HTO DCS or HTO silane) and a thin film 24 that results from thinning of the donor substrate 21 and that can act as a crystalline growth seed for epitaxy.

The composite structure 23 may also undergo a second bonding stabilization anneal carried out at 1100° C. for 1 hour (step S25).

The surface of the thin film 24 may then be prepared for epitaxy by chemical mechanical polishing (CMP), light chemical etching and/or plasma etching with the aim of reducing its surface roughness (step S26). Epitaxial growth of a type III/N layer of material 25 may then be carried out on the thin film 24 (step S27, FIG. 3D) without the appearance of microcavities nor of any delamination.

What is claimed is:

1. In a composite structure comprising an oxide bonding layer and a thin film bonded to a support substrate, a method of preventing microcavity formation in the bonding layer due to irreversible transition of the oxide from an elastic mode of deformation to a plastic mode of deformation resulting from creep and thermal expansion due to high temperature exposure of the composite structure, which method comprises:
    providing the thin film with a thickness of 5 micrometers or less;
    providing the bonding layer of oxide with a thickness that is equal to or greater than the thickness of the thin film, with the bonding layer formed between the support substrate and the thin film by low pressure chemical vapor deposition (LPCVD) on either a bonding face of the support substrate or a bonding face of the thin film, or both, to produce the deposited oxide of the bonding layer with a temperature stability that is close to that of an oxide obtained by thermal oxidation;
    selecting the thin film or support substrate, whichever is to receive the bonding layer, to be of a material having a mean thermal expansion coefficient of $7\times10^{-6}$ $K^{-1}$ or more; and
    bonding the thin film to the support substrate with the bonding layer therebetween,
    wherein the combination of the thin film, bonding layer and support substrate reduce stress in and plastic deformation of the bonding layer during exposure to high temperatures of more than approximately 900° C. to thus prevent microcavities from appearing in the bonding layer.

2. The method of claim 1, wherein the bonding layer of oxide is an oxide of silicon formed using precursors of silane, dichlorosilane or tetra-ethyl orthosilicate.

3. The method of claim 1, which further comprises, prior to bonding, conducting a densification heat treatment of the layer of oxide.

4. The method of claim 3, wherein the densification heat treatment step is carried out at a temperature that is higher than the temperature at which the bonding layer of oxide is deposited.

5. The method of claim 1, wherein the thin film is transferred to the support substrate by:
    implanting ions by bombardment of a face of a donor substrate to form, at a predetermined depth in the donor substrate, a layer of weakness defining the thin film between the donor substrate face and the layer of weakness;

placing the donor substrate face in intimate contact with the support substrate to bond the two together; and detaching the thin film splitting at the layer of weakness of the donor substrate.

6. The method of claim 1, wherein the thin film is transferred to the support substrate by:

bringing one face of a donor substrate into intimate contact with the support substrate to bond the two together; and thinning the donor substrate to leave only the thin film on the support substrate.

7. The method of claim 6, which further comprises, after the bonding step, conducting a bonding stabilization annealing at a temperature of more than approximately 900° C.

8. The method of claim 1, wherein the thin film is approximately 0.3 micrometers thick.

9. The method of claim 1, wherein the bonding oxide layer is approximately 0.4 micrometers thick.

10. The method of claim 1, wherein the support substrate comprises sapphire, $LiTaO_3$, $LiNbO_3$, MgO, or an alloy of Ni, Cr, Mo and W.

11. The method of claim 1, wherein the thin film comprises sapphire, $LiTaO_3$, $LiNbO_3$, or MgO.

12. The method of claim 1, which further comprises providing at least one layer of semiconductor material on the thin film of the composite structure.

13. A method of producing at least one layer of semiconductor material, by epitaxial growth of the at least one layer of semiconductor material on a composite structure that is made according to the method of claim 1, wherein the epitaxial growth is carried out on the thin film of the composite structure without generating microcavities in the bonding layer.

14. The method of claim 13, wherein the layer of epitaxially grown semiconductor material is a layer of a binary, ternary, or quaternary HUN material.

15. The method of claim 13, wherein the epitaxial growth is carried out for a predetermined period corresponding to the formation of a thickness of semiconductor material or a cumulative thickness of the semiconductor material layer and the thin film of at least 10 micrometers.

* * * * *

UNITED STATES PATENT AND TRADEMARK OFFICE
CERTIFICATE OF CORRECTION

Page 1 of 1

PATENT NO.          : 9,242,444 B2
APPLICATION NO.     : 14/031498
DATED               : January 26, 2016
INVENTOR(S)         : Bruce Faure and Alexandra Marcovecchio It is certified that error appears in the above-identified patent and that said Letters Patent is hereby corrected as shown below:

On the title page:
In ITEM (63) Related U.S. Application Data: change "filed as" to --filed on Dec. 8, 2009, as--

In the specification:
| | | |
|---|---|---|
| COLUMN 8, | LINE 45, | change "ions H'" to --ions H+-- |
| COLUMN 8, | LINE 46, | change "H' ions" to --H+ ions-- |

In the claims:
CLAIM 14,    COLUMN 12,    LINE 14,    change "HUN material." to --III/N material.--

Signed and Sealed this
Twenty-eighth Day of June, 2016

Michelle K. Lee
*Director of the United States Patent and Trademark Office*